(12) United States Patent
Nakamura

(10) Patent No.: US 7,560,997 B2
(45) Date of Patent: Jul. 14, 2009

(54) SEMICONDUCTOR INTEGRATED CIRCUIT DEVICE AND TEST METHOD THEREFOR

(75) Inventor: Yoshiaki Nakamura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 25 days.

(21) Appl. No.: 11/767,293

(22) Filed: Jun. 22, 2007

(65) Prior Publication Data
US 2008/0012651 A1 Jan. 17, 2008

(30) Foreign Application Priority Data
Jun. 26, 2006 (JP) .............................. 2006-175507

(51) Int. Cl.
G01R 23/00 (2006.01)
(52) U.S. Cl. ........................................ 331/44; 324/765
(58) Field of Classification Search .................. 331/14, 331/16, 18, 44; 324/76.72, 76.53, 537, 765
See application file for complete search history.

(56) References Cited

U.S. PATENT DOCUMENTS 5,701,087 A * 12/1997 Takano ........................ 324/765
6,008,655 A * 12/1999 Kuroda ........................ 324/537
6,091,304 A * 7/2000 Harrer ........................... 331/10
2003/0222669 A1* 12/2003 Takei et al. ................... 324/765
2004/0056725 A1* 3/2004 Kitamura et al. ........... 331/36 C

FOREIGN PATENT DOCUMENTS

| JP | 61-9003 A | 1/1986 |
| JP | 4-129317 A | 4/1992 |
| JP | 2005-123927 A | 5/2005 |

* cited by examiner

Primary Examiner—James H. Cho
Assistant Examiner—Jany Tran
(74) Attorney, Agent, or Firm—Sughrue Mion, PLLC

(57) ABSTRACT

During testing frequency divider PS, test control voltage signal TC and RF test signal TS are supplied via balun Ti to input terminals IN1 and IN2. Test control voltage signal TC flows through resistors R1, R2 to turn on NPN transistor Q0. A current from current source I1 then ceases to be supplied through voltage-controlled oscillator V1 and buffer B10 to voltage-controlled oscillator V1 and buffer B10 to halt their operation. Output impedance of buffer B10 is increased. Since potential of input terminals is that of test control voltage signal TC, varactor diodes VD1, VD2 are forward-biased, increasing capacitance values of the varactor diodes further. RF test signal TS may be supplied to frequency divider PS, through varactor diodes VD1, VD2, without being affected by buffer B10 exhibiting high output impedance. Chip area of test circuit for PLL circuit is reduced.

11 Claims, 5 Drawing Sheets

REFERENCE CASE

US 7,560,997 B2

SEMICONDUCTOR INTEGRATED CIRCUIT DEVICE AND TEST METHOD THEREFOR

REFERENCE TO RELATED APPLICATIONS

The present application is claiming the priority of the earlier Japanese patent application No. 2006-175507 filed on Jun. 26, 2006, the entire disclosure thereof being incorporated herein by reference thereto.

FIELD OF THE INVENTION

This invention relates to a semiconductor integrated circuit device and a testing method therefor. More particularly, this invention relates to a technique for testing a frequency divider in a semiconductor integrated circuit device having enclosed therein a PLL (Phase Locked Loop) circuit.

BACKGROUND OF THE INVENTION

A PLL circuit is well-known as a frequency converter circuit. This PLL circuit includes a frequency divider (pre-scaler) for reducing the frequency of a reference clock signal or a local oscillation (Lo) signal to a control frequency. This PLL circuit needs to be measured and checked in a development stage or at the time of mass production or shipping. The PLL circuit may frequently be enclosed within the semiconductor integrated circuit device. In measuring the PLL circuit, it is practiced to supply a signal of the frequency and the power, desired to be used for evaluation, from the outside equipment to the frequency divider, in a manner free from the influence of self-oscillations of the voltage controlled oscillator (VCO), and to monitor the frequency of the output signal to measure the input sensitivity.

FIG. 3 depicts a block diagram showing an illustrative constitution of a conventional semiconductor integrated circuit device. Referring to FIG. 3, a PLL circuit is constituted during the normal operation by a feedback loop composed of a voltage controlled oscillator V100, a buffer B100, a frequency divider PS, a phase comparator PC and a charging pump CP. The oscillation frequency of the voltage controlled oscillator V100 is controlled so that the output signal of the frequency divider PS will be in phase with a signal at a reference signal input terminal S1.

The input terminals of the voltage controlled oscillator V100, such as base terminals, not shown, supplied with positively fed back outputs of a differential amplifier that makes up the voltage controlled oscillator, are derived to outside as input terminals IN11 and IN12 via capacitors C11, C12. In testing, an RF test signal TS is supplied from a signal generator to the input terminals IN11 and IN12 via balun T100. The power and the frequency of the RF test signal TS are subjected to sweeping at this time to test the input sensitivity.

The voltage controlled oscillator V100 normally includes an enclosed tank circuit. If, in particular, there is not provided a mode for controlling the voltage controlled oscillator V100, the voltage controlled oscillator begins oscillating at the same time as the power supply is connected in circuit. Hence, a signal of the voltage controlled oscillator V100 in the self-running state is supplied to the frequency divider PS being tested. It is however possible to control the power and the frequency of the output signal of the voltage controlled oscillator V100, by e.g., an external signal generator, a signal of a magnitude sufficient to control the self-oscillations of the voltage controlled oscillator V100 is supplied to the input terminals IN11, IN12. This controlled signal may be supplied to the frequency divider PS to measure an output and hence the input sensitivity.

SUMMARY OF THE DISCLOSURE

The following analysis is given by the present invention.

If, in the above measurement method, the signal supplied from outside is of a signal intensity sufficient to control the self-oscillations of the voltage controlled oscillator V100, no particular problem would be raised. However, there are cases where the lower limit value of the input power of the input sensitivity curve, shown in FIG. 4, is changed by tens of decibels with changes in frequency. If the low level power with which it is not possible to control the self-oscillations, as in the case of measuring the lower limit side values, described above, correct measurement cannot be made with ease under the condition that the signal at the self-running frequency of the voltage controlled oscillator V100 is output.

To enable correct measurement, such a semiconductor integrated circuit device, provided with test mode switching means, may be thought of. FIG. 5 depicts a block diagram showing another illustrative constitution of a conventional semiconductor integrated circuit device. Referring to FIG. 5, a semiconductor integrated circuit device 101 includes a voltage controlled oscillator VCO V101, a frequency divider PS, a phase comparator PC, a charge pump CP, buffers B10, B11, a current supply I10, a switch SW, capacitors C11, C12, test signal input terminals IN11, IN12, a test control terminal CON and a reference signal input terminal S1.

During the normal operation, a movable contact of the switch SW is set to its upper fixed terminal to permit the current of the current source I10 to flow to the buffer B10 and the voltage controlled oscillator V101 by a signal of a test control terminal CON to enable the operation of the buffer and the voltage controlled oscillator. As the current of the current source I10 is supplied to cause the operations of the buffer B10 and the voltage controlled oscillator V101, there is established a PLL circuit by a feedback loop composed of the voltage controlled oscillator VCO V101, buffer B10, frequency divider PS, phase comparator PC and the charge pump CP. The oscillation frequency of the voltage controlled oscillator VCO V101 is controlled so that the output signal of the frequency divider PS will be in phase with a signal at a reference signal input terminal S1.

On the other hand, upon testing the frequency divider PS, the movable contact of the switch SW is set to its lower fixed terminal to permit the current of the current source I10 to be supplied to the buffer B11 by a signal of the test control terminal CON to enable the operation of the buffer B11 as the operation of the buffer B10 and the voltage controlled oscillator VCO V101 ceases. An RF test signal TS is supplied via balun T100 to the test input terminals IN11, IN12 as non-inverting signal and as inverting signal, respectively. The RF test signal TS is thence supplied via capacitors C11, C12 and buffer B11 to the frequency divider PS to test the frequency divider PS.

As related techniques, a method for halting the voltage controlled oscillator is disclosed in Patent Publications 1 to 3, for example. In these Patent Documents, attention is directed to characteristics on halting or on releasing the halting, while it is not targeted to enable a facilitated testing operation.

[Patent Document 1] JP Patent Kokai Publication No. JP-A-61-9003

[Patent Document 2] JP Patent Kokai Publication No. JP-A-4-129317

[Patent Document 3] JP Patent Kokai Publication No. JP-P2005-123927A

The following analysis is further given by the present invention. The entire disclosures of the above mentioned Patent Documents are herein incorporated by reference thereto.

In the related art, the test signal can be reliably supplied to the frequency divider by the switch, operating as a switching means, thus ensuring reliable testing. It is however necessary to provide the semiconductor integrated circuit device with the buffer B11 for supplying a test signal, switch SW, a test control terminal CON and a control circuit for controlling the switch SW by a test control signal supplied to the test control terminal CON. Since these components are provided in the semiconductor integrated circuit device, the chip area tends to be increased.

In one aspect, the present invention provides a semiconductor integrated circuit device comprising: a phase locked loop including a phase comparator, a voltage controlled oscillator and a frequency divider. The phase comparator compares the phase of a reference signal and the phase of an output signal of a frequency divider to detect phase difference therebetween. The voltage controlled oscillator generates an oscillation signal controlled to render the phase difference constant, and the frequency divider divides the frequency of the oscillation signal to output the resulting frequency divided signal to the phase comparator. The semiconductor integrated circuit device further comprises a test signal input terminal device, a capacitive device arrangement and a control circuit. The capacitive device arrangement is connected between the test signal input terminal device and an input end of the frequency divider. The control circuit is connected to the test signal input terminal device. The control circuit exercises control so that, when a d.c. voltage is applied to the test signal input terminal device, the buffer circuit, connected to an output side of the voltage controlled oscillator, will not be in operation.

In another aspect, the present invention provides a test method for a semiconductor integrated circuit device comprising a phase locked loop (PLL) circuit, a test signal input terminal device, a capacitive device arrangement and a control circuit. The phase locked loop includes a phase comparator that compares a phase of a reference signal with a phase of an output signal of a frequency divider to detect phase difference therebetween, a voltage controlled oscillator that generates an oscillation signal controlled to render the phase difference constant, and the frequency divider that divides the frequency of the oscillation signal to output a resulting frequency divided signal to the phase comparator. The capacitive device is connected between the test signal input terminal device and an input end of the frequency divider. The control circuit is connected to the test signal input terminal device. The control circuit exercises control so that, when a d.c. voltage is applied to the test signal input terminal device, the buffer circuit, connected to an output side of the voltage controlled oscillator, will not be in operation. The method comprises applying the d.c. voltage and a test signal for the frequency divider to the test signal input terminal device to test the frequency divider.

The meritorious effects of the present invention are summarized as follows.

According to the present invention, in which a test signal is input as the bias voltage is supplied, and a test is conducted as the output stage of the voltage controlled oscillator is isolated from the frequency divider, the chip area of the circuit needed for testing may be smaller than in a conventional system.

BRIEF DESCRIPTIONS OF THE DRAWINGS

PREFERRED MODES OF THE INVENTION

Figure 1:
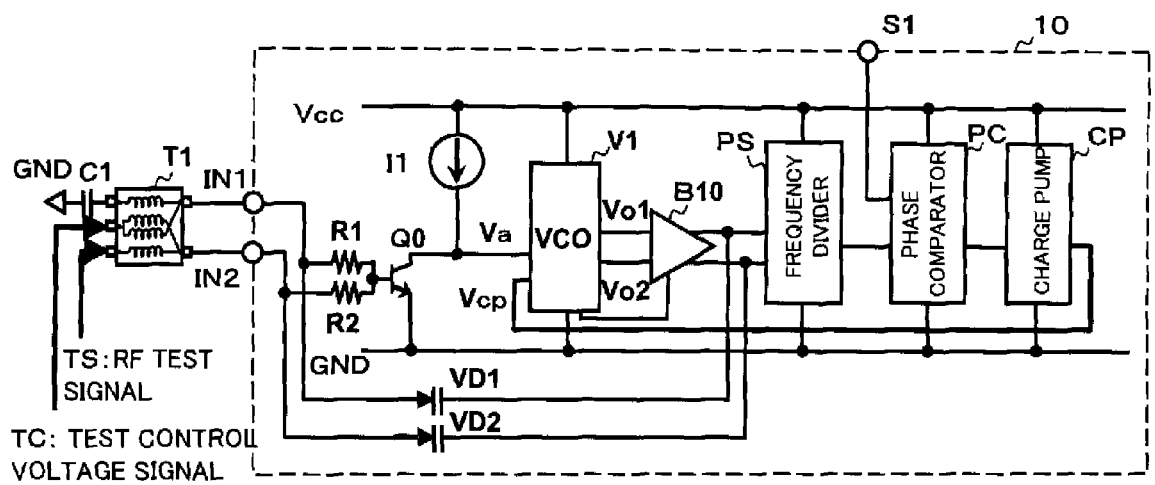
FIG. 1 is a block diagram showing the constitution of a semiconductor integrated circuit device according to an example of the present invention.

The capacitive device may be a varactor diode arrangement.

The varactor diode arrangement may be reverse-biased and forward-biased during normal operation and during testing of the PLL circuit, respectively.

The test signal input terminal device may be formed of two input terminals receiving a non-inverting test signal and an inverting test signal: the varactor diode arrangement may comprise two varactor diodes connected to the two input terminals; and the non-inverting test signal and the inverting test signal, supplied to the input terminals, may be supplied to the frequency divider.

The control circuit may exercise control to halt supply of the power supply current to the voltage controlled oscillator and to the buffer circuit when the d.c. voltage is supplied to the test signal input terminal device.

The test signal input terminal device may comprise two input terminals receiving a non-inverting test signal and an inverting test signal; the capacitive device may comprise two varactor diodes connected to the two input terminals so that the varactor diodes are reverse-biased during the normal operation and forward-biased during testing of the PLL circuit; and the non-inverting test signal and the inverting test signal may be supplied to the two input terminals.

The d.c. voltage and the test signal for the frequency divider may be supplied to the two input terminals via a balun The semiconductor integrated circuit device, according to an example of the present invention, includes a PLL circuit, a pair of test signal input terminals, a pair of capacitive devices, such as varactor diodes, connected between the test signal input terminals and an input end of a frequency divider in the PLL circuit, and a control circuit connected to the test signal input terminals. Preferably, the capacitive device is a varactor diode reverse-biased during the normal operation of the PLL circuit and forward-biased when the d.c. voltage is applied to the test signal input terminals. This varactor diode may be provided as a spare part for the varactor diode constituting the voltage controlled oscillator in the PLL circuit. The control circuit may be designed to exercise control so that, in case the d.c. voltage is applied to the test signal input terminals, the operation of the buffer circuit connected to an output side of the voltage controlled oscillator and the supply of the power supply current to the voltage controlled oscillator and the buffer circuit will cease.

In testing the above-described semiconductor integrated circuit device, the d.c. voltage and a test signal for the frequency divider (RF test signal) are applied to the test signal input terminals to test the frequency divider. The test signal input terminals may be two input terminals supplied with a non-inverting test signal and an inverting test signal. The varactor diodes may be two varactor diodes connected to the two input terminals. These varactor diodes may be supplied with the non-inverting and inverting test signals for the frequency divider as differential or complementary signals through a balun and the input terminals. The d.c. voltage is supplied simultaneously to the two input terminals through the balun.

With the above-described semiconductor integrated circuit device, in which the test input terminals, capacitive device, such as varactor diodes, and the control circuit, make up a test circuit, and a test signal is supplied as a bias signal is supplied, the output circuit of the voltage-controlled oscillator may be substantially isolated, that is, set to a high impedance state, to eliminate the influence on the frequency divider. This provides a test circuit for testing the frequency divider correctly and reduces the area taken up by the test circuit. The examples of the present invention will now be described with reference to the accompanying drawings.

FIRST EXAMPLE

FIG. 1 depicts a block diagram showing the constitution of a semiconductor integrated circuit device 10 according to an example of the present invention. Referring to FIG. 1, the semiconductor integrated circuit device 10 includes a voltage-controlled oscillator V1, a frequency divider PS, a phase comparator PC, a charge pump CP, a buffer B10, a current source I1, resistors R1 and R2, and an NPN transistor Q0. The semiconductor integrated circuit device also includes varactor diodes VD1, VD2, input terminals IN1, IN2 for test signals and an input terminal for a reference signal S1. The varactor diodes VD1, VD2 are routinely provided for adjustment purposes in the vicinity of the voltage-controlled oscillator V1, and are spare varactor diodes of the same capacitance value for use as a tank for the voltage-controlled oscillator V1.

In FIG. 1, the input terminals IN1, IN2 are respectively connected to one ends of resistors R1 and R2, the other ends of which are connected common to the base of the NPN transistor Q0. The NPN transistor Q0 has an emitter grounded, while having a collector connected to a current source I1 and to a control terminal Va of the voltage-controlled oscillator V1. The input terminals IN1, IN2 are connected to anodes of the varactor diodes VD1, VD2, respectively, cathodes of which are connected to a non-inverting output terminal and an inverting output terminal of a buffer B10 (a non-inverting input terminal and an inverting input terminal of a frequency divider PS). A PLL circuit is constituted by a feedback loop made up of the voltage-controlled oscillator V1, buffer B10, frequency divider PS, phase comparator PC and the charge pump CP. The oscillation frequency of the voltage-controlled oscillator V1 is controlled so that the output signal of the frequency divider PS and the signal at the input terminal S1 for the reference signal will be in phase with each other.

Figure 2:
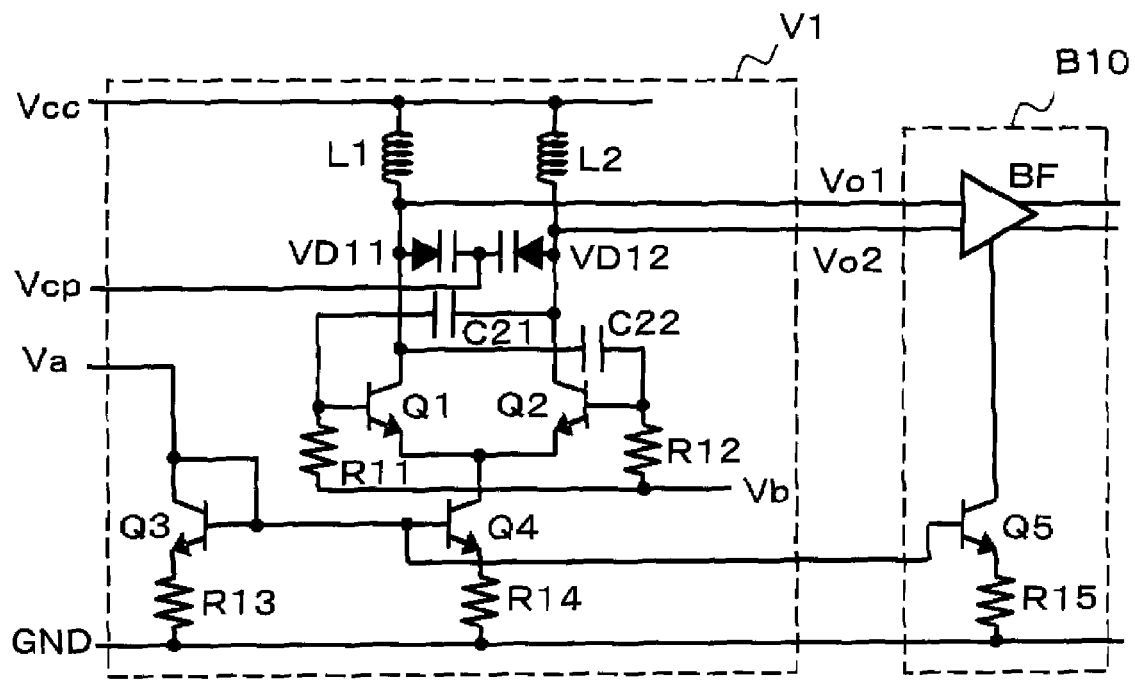
FIG. 2 is a circuit diagram showing an illustrative constitution of a conventional semiconductor integrated circuit device.
Figure 3:
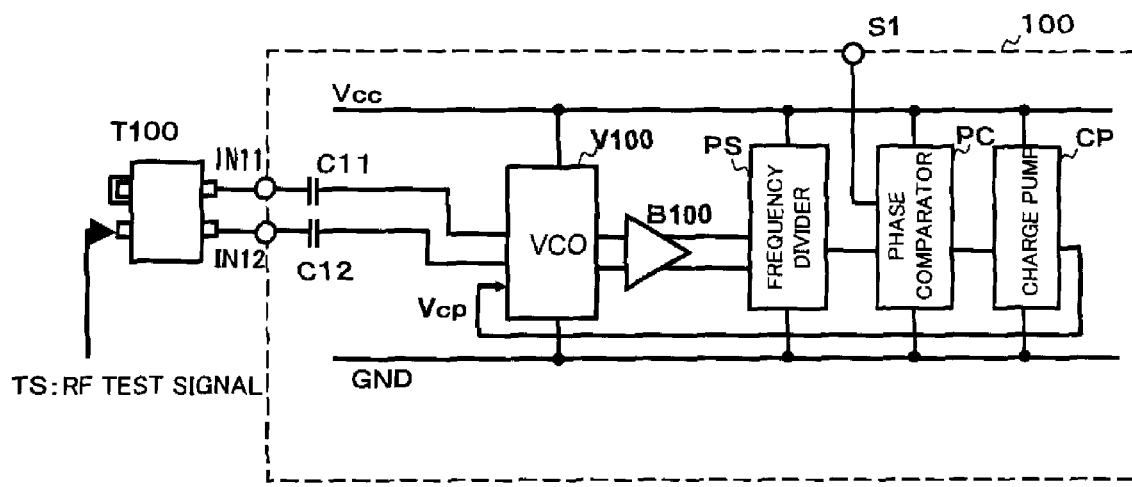
FIG. 3 is a block diagram showing the constitution of a semiconductor integrated circuit device of the related art.
Figure 4:
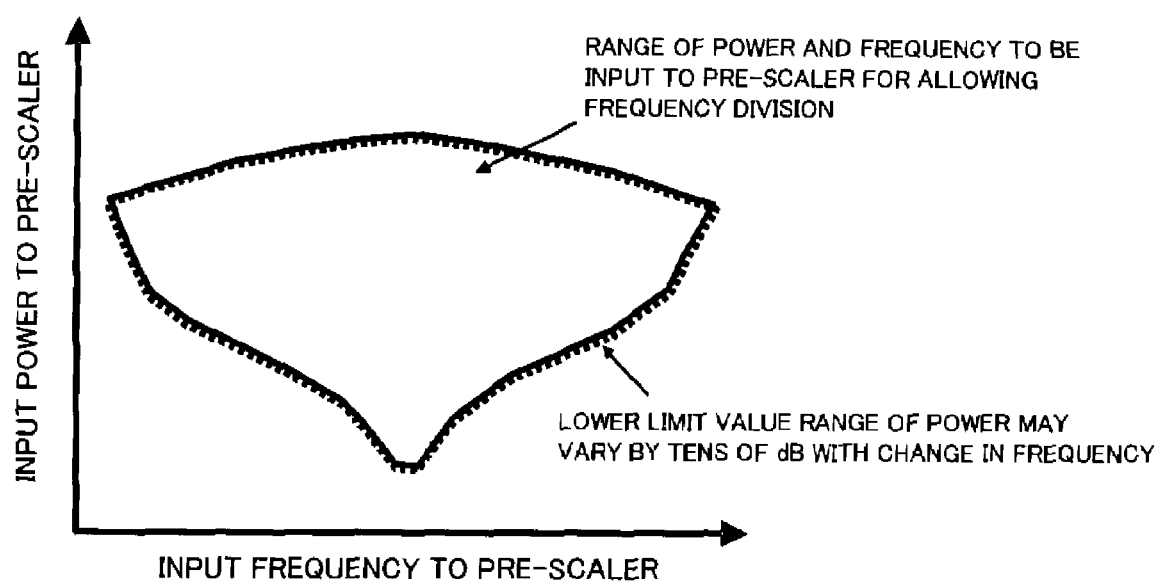
FIG. 4 is a graph showing input sensitivity characteristics of a frequency divider.
Figure 5:
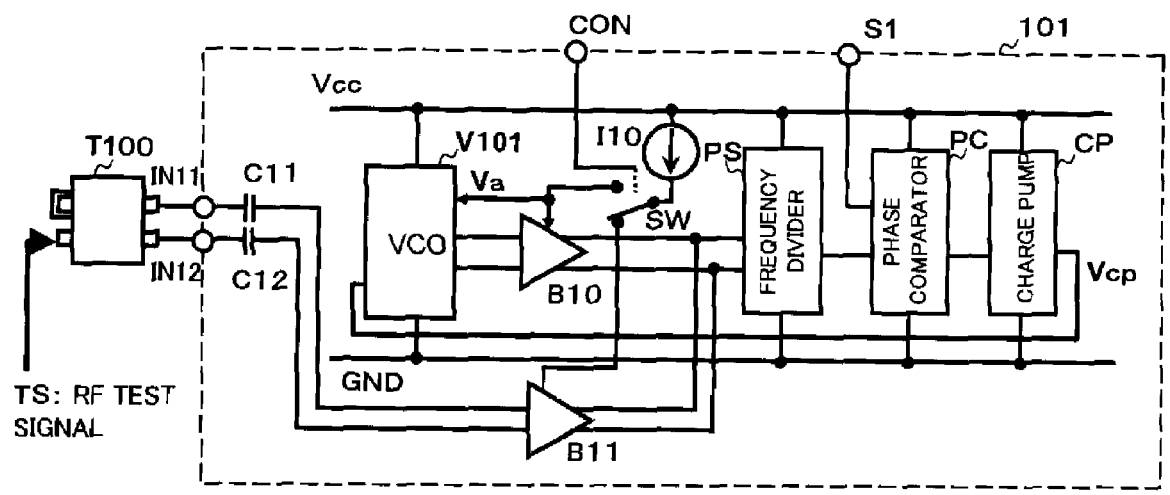
FIG. 5 is a block diagram showing the constitution of another semiconductor integrated circuit device of the related art.

The constitution of the voltage-controlled oscillator V1 and the buffer B10 is now described. FIG. 2 depicts a circuit diagram for the voltage-controlled oscillator V1 and a buffer unit B10. In FIG. 2, the voltage-controlled oscillator V1 includes inductors L1, L2, varactor diodes VD11, VD12, capacitors C21, C22, NPN transistors Q1 to Q4, and resistors R11 to R14. The buffer unit B10 includes a buffer circuit BF, an NPN transistor Q5 and a resistor R15.

In FIG. 2, the collector of the NPN transistors Q1 is connected via inductor L1 to a power supply Vcc, while also being connected to an anode of the varactor diode VD11, one end of the capacitor C22 and to one input end of the buffer circuit BF. The collector of the NPN transistors Q2 is connected via inductor L2 to the power supply Vcc, while also being connected to an anode of the varactor diode VD12, one end of the capacitor C21 and to the other input end of the buffer circuit BF. To cathodes of the varactor diodes VD11, VD12 is supplied an oscillation control voltage Vcp output from the charge pump CP. The base of the NPN transistor Q1 is connected to the other end of the capacitor C21 and supplied with a bias voltage Vb via resistor R11. The base of the NPN transistor Q2 is connected to the other end of the capacitor C22 and supplied with the bias voltage Vb via resistor R12. The emitters of the NPN transistors Q1, Q2 are in common connected to the collector of the NPN transistor Q4. A control terminal Va is connected to bases of the NPN transistors Q3 to Q5 and to the collector of the NPN transistor Q3. Emitters of the NPN transistors Q3 to Q5 are grounded via resistors R13 to R15, respectively. The collector of the NPN transistor Q5 is connected to a grounding side power supply of the buffer circuit BF.

In the above-described voltage-controlled oscillator V1, the NPN transistors Q1, Q2 and the capacitors C21, C22 make up a negative resistance (i.e., having a negative coefficient of resistance) circuit, while the inductors L1, L2 and the varactor diodes VD11, VD12 make up a tank circuit. The capacitance values of the varactor diodes VD11, VD12 are changed by the oscillation control voltage Vcp to control the resonance frequency of the tank circuit. The NPN transistors Q3, Q4 and Q5 make up a mirror circuit, and the current flowing from the control terminal Va controls the on/off of the voltage-controlled oscillator V1 and the buffer circuit BF. That is, if the current flowing from the control terminal Va is not less than a preset value, the voltage-controlled oscillator V1 and the buffer circuit BF come into operation so that non-inverting and inverting oscillation signals of the oscillation frequency controlled by the oscillation control voltage Vcp are supplied from the voltage-controlled oscillator V1 to the buffer circuit BF. The buffer circuit outputs inverting and non-inverting oscillations signals to the frequency divider PS. If conversely the current flowing from the control terminal Va is less than the preset value, the operations of the voltage-controlled oscillator V1 and the buffer circuit BF are halted with the buffer circuit BF being high in output impedance.

In FIG. 1, the input terminals IN1, IN2 are open during normal4 use time. In case the NPN transistor Q0 is an NMOS transistor, its input terminal is at a ground voltage. Hence, the NPN transistor Q0 is off so that the current of the current source I1 is supplied via control terminal Va to the voltage-controlled oscillator V1. With the voltage-controlled oscillator V1 and the buffer circuit BF in operation, a PLL circuit is formed. Thus, the oscillation frequency of the voltage-controlled oscillator V1 is controlled so that the output signal of the frequency divider PS will be in phase with the signal at the input terminal for reference signal S1. Since the potential of the input terminals IN1, IN2 is near the ground level, the varactor diodes VD11, VD12 are reverse-biased so that the capacitance values thereof are lowered. On the other hand, the resistance values of the resistors R1 and R2 are high, and the impedance on the sides of the varactor diodes VD1, VD2 on the output side of the buffer circuit BF is so high as to allow negligence. So, the operation of the PLL circuit is not affected by the varactor diodes VD1, VD2 being connected to the output side of the buffer circuit BF.

During testing of the frequency divider PS, a test control voltage signal TC and an RF test signal TS are supplied to the input terminals IN1, IN2 via a balun T1 arranged along with the semiconductor integrated circuit device 10 on an evaluation substrate. A test control voltage signal TC flows through the resistors R1 and R2 to give a d.c. bias which allows the NPN transistor Q0 to be turned on. With the NPN transistor Q0 on, the current from the current source I1 flows through the NPN transistor Q0. Hence, the voltage-controlled oscillator V1 and the buffer circuit BF are no longer supplied with the current from the current source I1 and hence the operation thereof ceases, thus setting up a high output impedance of the buffer circuit BF. The RF test signal TS is supplied via varactor diodes VD1, VD2 to the frequency divider PS. At this time, the potential of the input terminals IN1, IN2 is equal to the potential of the test control voltage signal TC. Hence, the varactor diodes VD1, VD2 are forwardly biased so that their capacitance values become higher. So, the RF test signal, supplied to the input terminals IN1, IN2 may be supplied to the frequency divider PS without being affected by the buffer circuit BF which has been turned off to exhibit a high impedance state. Consequently, the characteristics of the frequency divider PS may be evaluated with the power set to high accuracy.

Thus, as described above, the operation of the voltage-controlled oscillator V1 is controlled, during testing, in dependence upon whether or not bias is to be applied to the NPN transistor connected via resistors R1, R2 to the input terminals IN1, IN2. Hence, the voltage-controlled oscillator V1 may be controlled by a tester or a d.c. source from outside the semiconductor integrated circuit device. Only two test terminals for the semiconductor integrated circuit device are sufficient, while the test control circuit may be simplified in structure. The chip area may be suppressed from increasing by using spare varactor diodes arranged in the vicinity of the voltage controlled oscillator in the semiconductor integrated circuit device.

Although the present invention has so far been described with reference to preferred examples, the present invention is not to be restricted to the examples. It is to be appreciated that those skilled in the art can change or modify the examples without departing from the scope and spirit of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device comprising:
   a phase locked loop; said phase locked loop including a phase comparator that compares a phase of a reference signal with a phase of an output signal of a frequency divider to detect phase difference therebetween, a voltage controlled oscillator that generates an oscillation signal controlled to render said phase difference constant, and said frequency divider that divides the frequency of said oscillation signal to output the resulting frequency divided signal to said phase comparator;
   said semiconductor integrated circuit device further comprising:
   a test signal input terminal device;
   a capacitive device connected between said test signal input terminal device and an input end of said frequency divider; and
   a control circuit connected to said test signal input terminal device; said control circuit exercising control so that, when a d.c. voltage is applied to said test signal input terminal device, a buffer circuit, connected to an output side of said voltage controlled oscillator, will not be in operations,
   wherein said capacitive device comprises a varactor diode arrangement.

2. The semiconductor integrated circuit device according to claim 1, wherein said varactor diode arrangement is reverse-biased and forward-biased during normal operation and during testing of said PLL circuit, respectively.

3. The semiconductor integrated circuit device according to claim 1, wherein said test signal input terminal device is formed of two input terminals receiving a non-inverting test signal and an inverting test signal;
   said varactor diode arrangement comprises two varactor diodes connected to said two input terminals; and
   said non-inverting test signal and the inverting test signal, supplied to said input terminals, are supplied to said frequency divider.

4. The semiconductor integrated circuit device according to claim 1, wherein said control circuit exercises control to halt supply of the power supply current to said voltage controlled oscillator and to said buffer circuit when said d.c. voltage is supplied to said test signal input terminal device.

5. A test method for a semiconductor integrated circuit device comprising:
   providing a semiconductor integrated circuit device comprising:
   a phase locked loop circuit; said phase locked loop circuit including: a phase comparator that compares a phase of a reference signal with a phase of an output signal of a frequency divider to detect phase difference therebetween, a voltage controlled oscillator that generates an oscillation signal controlled to render said phase difference constant, and said frequency divider that divides the frequency of said oscillation signal to output the resulting frequency divided signal to said phase comparator; said semiconductor integrated circuit device further comprising:
   a test signal input terminal device;
   a capacitive device connected between said test signal input terminal device and an input end of said frequency divider; and
   a control circuit connected to said test signal input terminal device; said control circuit exercising control so that, when a d.c. voltage is applied to said test signal input terminal device, a buffer circuit, connected to an output side of said voltage controlled oscillator, will not be in operation;
   said method further comprising:
   applying said d.c. voltage and a test signal for said frequency divider to said test signal input terminal device to test said frequency divider
   wherein said test signal input terminal device comprises two input terminals receiving a non-inverting test signal and an inverting test signal;
   said capacitive device comprises two varactor diodes connected to said two input terminals so that said varactor diodes are reverse-biased during the normal operation and forward-biased during testing of said PLL circuit: and
   said non-inverting test signal and said inverting test signal are supplied to said two input terminals.

6. The test method for testing a semiconductor integrated circuit device according to claim 5, wherein said d.c. voltage and the test signal for said frequency divider are supplied to said two input terminals via a balun.

7. A semiconductor integrated circuit device comprising:

a phase locked loop; said phase locked loop including a phase comparator that compares a phase of a reference signal with a phase of an output signal of a frequency divider to detect phase difference therebetween, a voltage controlled oscillator that generates an oscillation signal controlled to render said phase difference constant, and said frequency divider that divides the frequency of said oscillation signal to output the resulting frequency divided signal to said phase comparator;

said semiconductor integrated circuit device fUrther comprising:

a test signal input terminal device;

a capacitive device connected between said test signal input terminal device and an input end of said frequency divider; and a control circuit connected to said test signal input terminal device; said control circuit exercising control so that, when a d.c. voltage is applied to said test signal input terminal device, a buffer circuit, connected to an output side of said voltage controlled oscillator, will not be in operation, wherein said control circuit comprises a resistance which is connected to a test signal input terminal device and a transistor whose base is connected to said resistance, and whose collector is connected to said voltage controlled oscillator.

8. The semiconductor integrated circuit according to claim 7, wherein the capacitive device comprises a varactor diode arrangement.

9. The semiconductor integrated circuit device according to claim 8, wherein said varactor diode arrangement is reverse-biased and forward-biased during normal operation and during testing of said PLL circuit, respectively.

10. The semiconductor integrated circuit device according to claim 8, wherein said test signal input terminal device is formed of two input terminals receiving a non-inverting test signal and an inverting test signal;

said varactor diode arrangement comprises two varactor diodes connected to said two input terminals; and said non-inverting test signal and the inverting test signal, supplied to said input terminals, are supplied to said frequency divider.

11. The semiconductor integrated circuit device according to claim 8, wherein said control circuit exercises control to halt supply of the power supply current to said voltage controlled oscillator and to said buffer circuit when said d.c. voltage is supplied to said test signal input terminal device.

* * * * *